(12) United States Patent  (10) Patent No.: US 7,462,960 B2
Or et al.  (45) Date of Patent: Dec. 9, 2008

(54) DRIVER FOR AN ULTRASONIC TRANSDUCER AND AN ULTRASONIC TRANSDUCER

(75) Inventors: Siu Wing Or, Hong Kong (HK); Chung Sheung Yung, Hong Kong (HK); Helen Lai Wa Chan-Wong, Hong Kong (HK)

(73) Assignee: The Hong Kong Polytechnic University, Kowloon, Hong Kong (CN)

( * ) Notice: Subject to any disclaimer, the term of this patent is extended or adjusted under 35 U.S.C. 154(b) by 0 days.

(21) Appl. No.: 10/751,718

(22) Filed: Jan. 5, 2004

(65) Prior Publication Data

US 2005/0146231 A1 Jul. 7, 2005

(51) Int. Cl.
 *H01L 42/06* (2006.01)
(52) U.S. Cl. ....................................................... 310/26
(58) Field of Classification Search .................... 310/26
 See application file for complete search history.

(56) References Cited

U.S. PATENT DOCUMENTS

| | | | |
|---|---|---|---|
| 3,852,999 A * | 12/1974 | Wright | 73/588 |
| 4,845,450 A * | 7/1989 | Porzio et al. | 335/215 |
| 5,047,683 A | 9/1991 | Butler et al. | |
| 5,488,955 A | 2/1996 | Dias et al. | |
| 5,510,660 A * | 4/1996 | Flatau et al. | 310/26 |
| 5,880,542 A * | 3/1999 | Leary et al. | 310/26 |
| 5,980,251 A | 11/1999 | Sullivan et al. | |
| 6,545,060 B1 | 4/2003 | Ruhman et al. | |
| 6,624,539 B1 | 9/2003 | Hansen et al. | |

* cited by examiner

*Primary Examiner*—Mark Budd
(74) *Attorney, Agent, or Firm*—Alix, Yale & Ristas, LLP

(57) ABSTRACT

An ultrasonic transducer driver has a giant magnetostrictive element, a fastener for holding the giant magnetostrictive element under mechanical pressure, a first field generator for providing a magnetic bias field, a second field generator for providing a magnetic drive field and a magnetic circuit for channelling the magnetic fields in the magnetostrictive element. An ultrasonic transducer for a bonding apparatus has a horn having a bonding tool at its smaller end and a mounting barrel adjoined onto it. The driver coupled to the larger end of the horn.

18 Claims, 9 Drawing Sheets a. Monolithic b. Pseudo 1-3 c. 0-3 d. 1-3 e. Radial 2-2 f. Parallel 2-2

DRIVER FOR AN ULTRASONIC TRANSDUCER AND AN ULTRASONIC TRANSDUCER

BACKGROUND OF THE INVENTION

1. Field of the Invention

The invention relates to drivers for ultrasonic transducers and to ultrasonic transducers. In particular the invention relates to a driver and ultrasonic transducer for use as a bonding apparatus in wire-bonding machines.

2. Description of Prior Art

Ultrasonic transducers on wire-bonding machines are used to apply pressure-and ultrasonic energy simultaneously for connecting the lead wires from a semiconductor component to a substrate. The ultrasonic transducer has an ultrasonic driver for converting driving signals from an ultrasonic signal generator into ultrasonic vibrations. A horn amplifies the ultrasonic vibrations from the driver and a bonding tool, which is normally in the form of a wedge or a capillary, located at the smaller end of the horn couples the amplified ultrasonic vibrations while applying a predetermined bond force to the lead wires and components being bonded together. Piezoelectric materials are used as the active (or driving) materials in the ultrasonic driver. It is difficult to induce electric polarization in thick piezoelectric elements and so a plurality of piezoelectric elements are stacked up to achieve the desired power level.

FIG. 1 shows a collapsed view and an exploded view of a prior art ultrasonic driver. The driver comprises a plurality of ring-shaped piezoelectric elements 1, 1', 1", 1''' connected electrically in parallel and mechanically in series under a mechanical pressure exerted by a pre-stress mechanism formed by a metallic threaded shaft 2 and a metallic nut 3. Thin ring-shaped electrodes 4, 4', 4", 4''', 4'''' are interposed between the piezoelectric elements 1, 1', 1", 1''', shaft 2 and nut 3 to provide electrical interconnection and external-connection with an ultrasonic signal generator (not shown).

A problem with piezoelectric ultrasonic transducers is that they are subject to accelerated aging and fail when operating at elevated electrical, mechanical and/or temperature stress to increase mechanical power output. These transducers are not considered inherently reliable in high-power applications. Although multiple piezoelectric elements could be combined or grouped to produce transducers with increased power-handling capability this would result in inefficient transducers that are not only larger and heavier but also difficult to assemble and costly to operate.

Prior to the use of piezoelectric materials, magnetostrictive transition metals, such as iron (Fe), cobalt (Co) and nickel (Ni) were sometimes used. Although these early transition metals are less susceptible to deterioration under use, they are heavy and bulky. More importantly, their low transduction capability and low energy density significantly limit the mechanical power output from a given electromagnetic power input and volume of the material and so increase the size and weight of the resulting transducer.

SUMMARY OF THE INVENTION

It is an object of the present invention to provide a driver for an ultrasonic transducer, and an ultrasonic transducer, for wire bonding applications that has improved power-handling capability, higher efficiency and better reliability, or which at least overcomes or ameliorates some of the disadvantages of prior art devices.

According to a first aspect of the invention there is provided an ultrasonic transducer driver comprising:
 a giant magnetostrictive element,
 a fastener for holding the giant magnetostrictive element under mechanical pressure,
 a first field generator for providing a magnetic bias field,
 a second field generator for providing a magnetic drive field, and
 a magnetic circuit for channelling the magnetic fields in the magnetostrictive element.

According to a second aspect of the invention there is provided an ultrasonic transducer for a bonding apparatus, said transducer comprising:
 a horn having a bonding tool at a smaller end and a mounting collar at an opposite end, and
 a driver coupled to the horn, the driver comprising a giant magnetostrictive element, a fastener for holding the giant magnetostrictive element under mechanical pressure, a first field generator for providing a magnetic bias field, a second field generator for providing a magnetic drive field, and a magnetic circuit for channelling the magnetic fields in the magnetostrictive element.

Preferably, the giant magnetostrictive element is a rare-earth-alloy-based material.

Preferably, the giant magnetostrictive element is Terfenol-D and its composites.

Preferably, the giant magnetostrictive element is cylindrical with a central hole.

Preferably, the giant magnetostrictive element is a composite comprising two or more rare-earth-based alloy parts separated from one another by a layer of passive polymeric material.

Preferably, the fastener is a threaded shaft and a nut made of nonmagnetic metallic material.

Preferably, the first field generator is a permanent magnet.

Preferably, the second field generator is an electric coil.

Preferably, the magnetic circuit is a magnetic enclosing circuit having a pair of magnetic return-path rings and a magnetic return-path cylinder made of high-permeability, high-resistivity and high-saturation material.

Further aspects of invention will become apparent from the following description which is given by way of example only.

BRIEF DESCRIPTION OF THE DRAWINGS

Embodiments of the invention will now be described by way of example only and with reference to the accompanying drawings in which.

DESCRIPTION OF THE PREFERRED EMBODIMENTS

In the following description the term "giant magnetostrictive material/element" refers to those ferromagnetic materials possessing unusually large magnetostrictive effect as compared with early transition metals, such as iron (Fe), cobalt (Co) and nickel (Ni).

These giant magnetostrictive materials are preferably but not exclusively rare-earth-alloy-based materials such as Terfenol-D and its composites.

Figure 1:
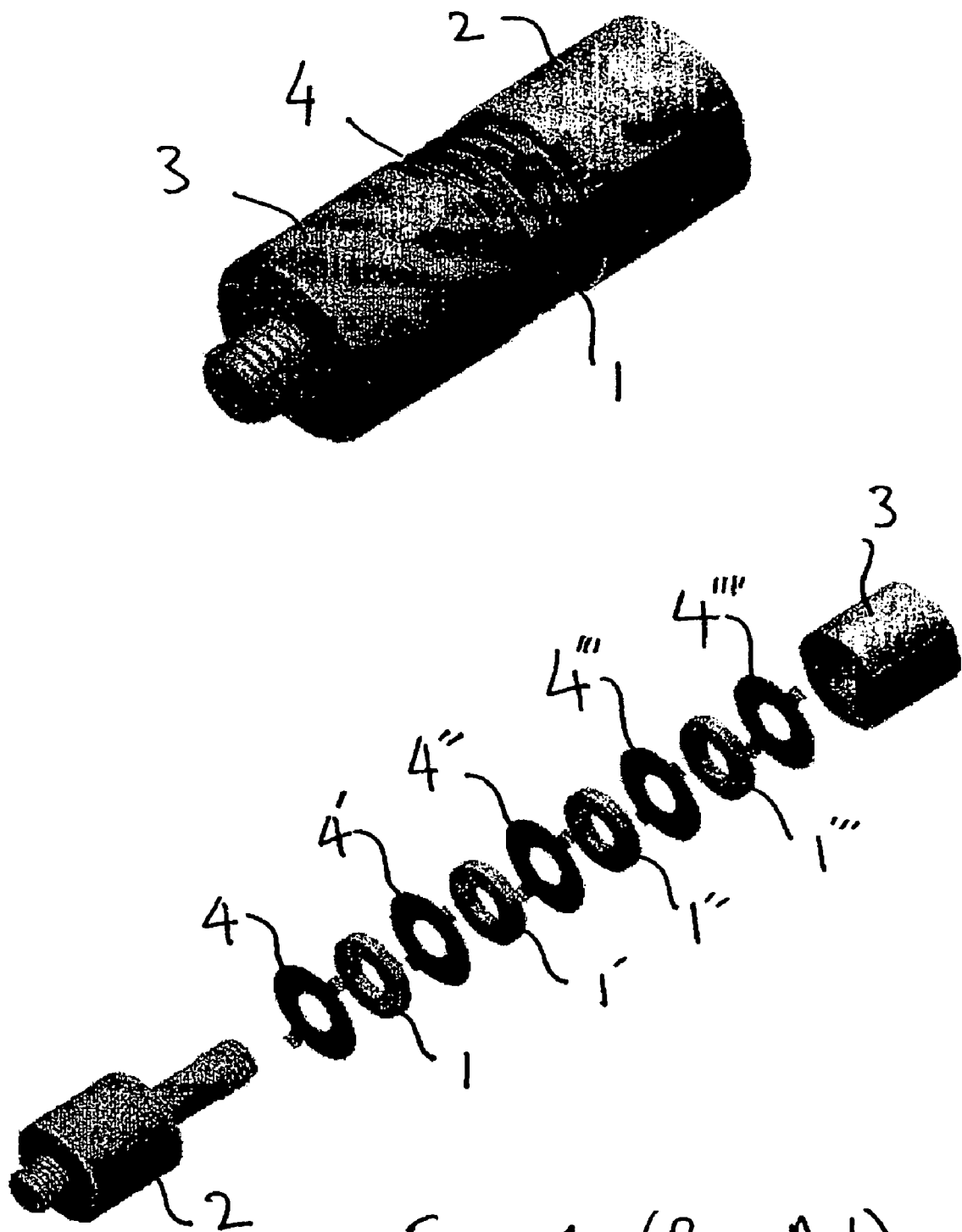
FIG. 1 shows a collapsed view and an exploded view of a prior art ultrasonic driver.
Figure 2:
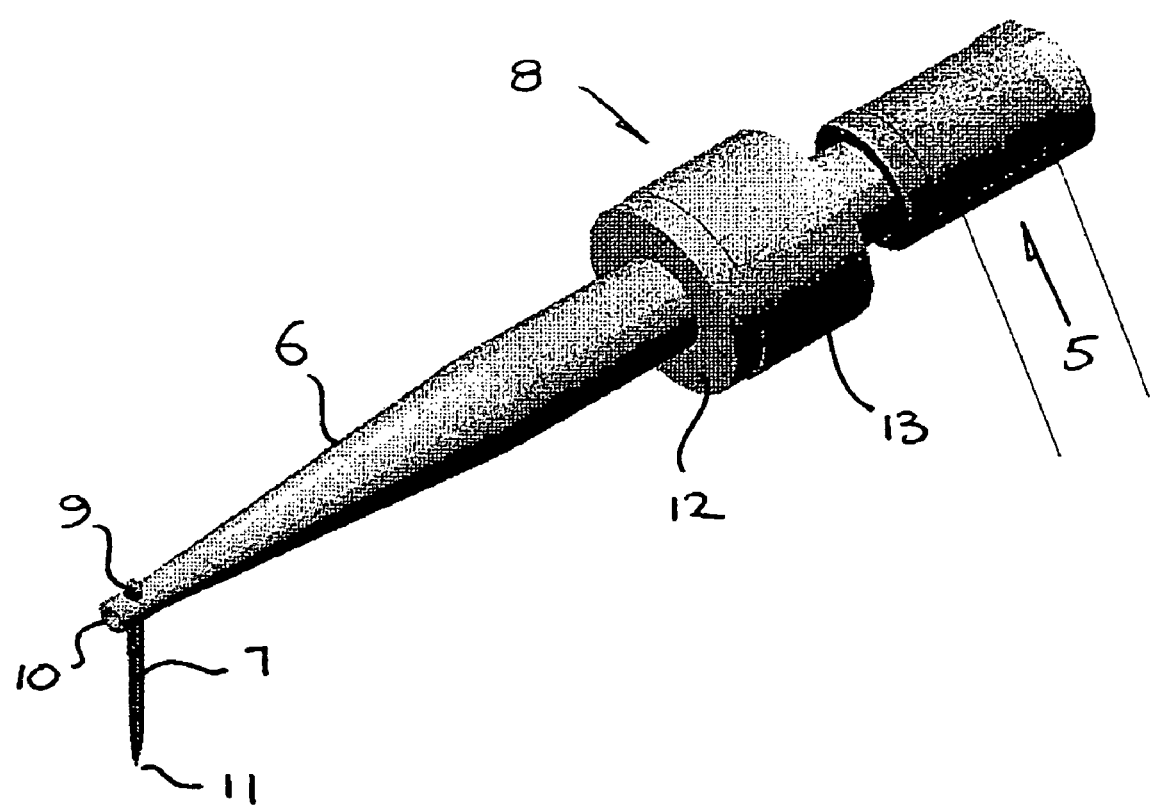
FIG. 2 illustrates an example ultrasonic transducer.

Referring to FIG. 2, an ultrasonic transducer consists of an ultrasonic driver 5, an ultrasonic horn 6, a bonding tool 7 and a barrel 8. The ultrasonic driver 5 is a pre-stressed sandwich transducer functioning as a half-wave, longitudinal, mass-spring-mass, linear vibrator to convert the electromagnetic energy generated by an ultrasonic signal generator (not shown) into longitudinal vibrations at ultrasonic frequencies. The ultrasonic horn 6 is used to couple and amplify the ultrasonic vibrations from the driver 5. The bonding tool 7, which is normally in the form of a wedge or a capillary, is clamped into the hole 9 drilled at the smaller end 10 of the horn 6 for coupling and further amplifying the ultrasonic vibrations with the maximum amplitude being located at its tip 11. The barrel 8, which is composed of a flange 12 and a collar 13, is for mounting the whole transducer onto a wire-bonding machine so that the predetermined bond force can be applied, together with the ultrasonic vibrations, to the lead wires and components being bonded together via the tip of the bonding tool. The flange part 12 of the barrel 8 is mechanically adjoined onto the horn 6 at a specific location corresponding to a nodal point of the longitudinal vibration (i.e., zero vibration amplitude) in order to avoid loss of energy and hence degradation of bonding performance. The collar part 13 is mechanically extended from the flange part 12 for further decoupling of the horn 6 from the wire-bonding machine. The transducer is mounted to the wire-bonding machine via the collar 13.

Figure 3:
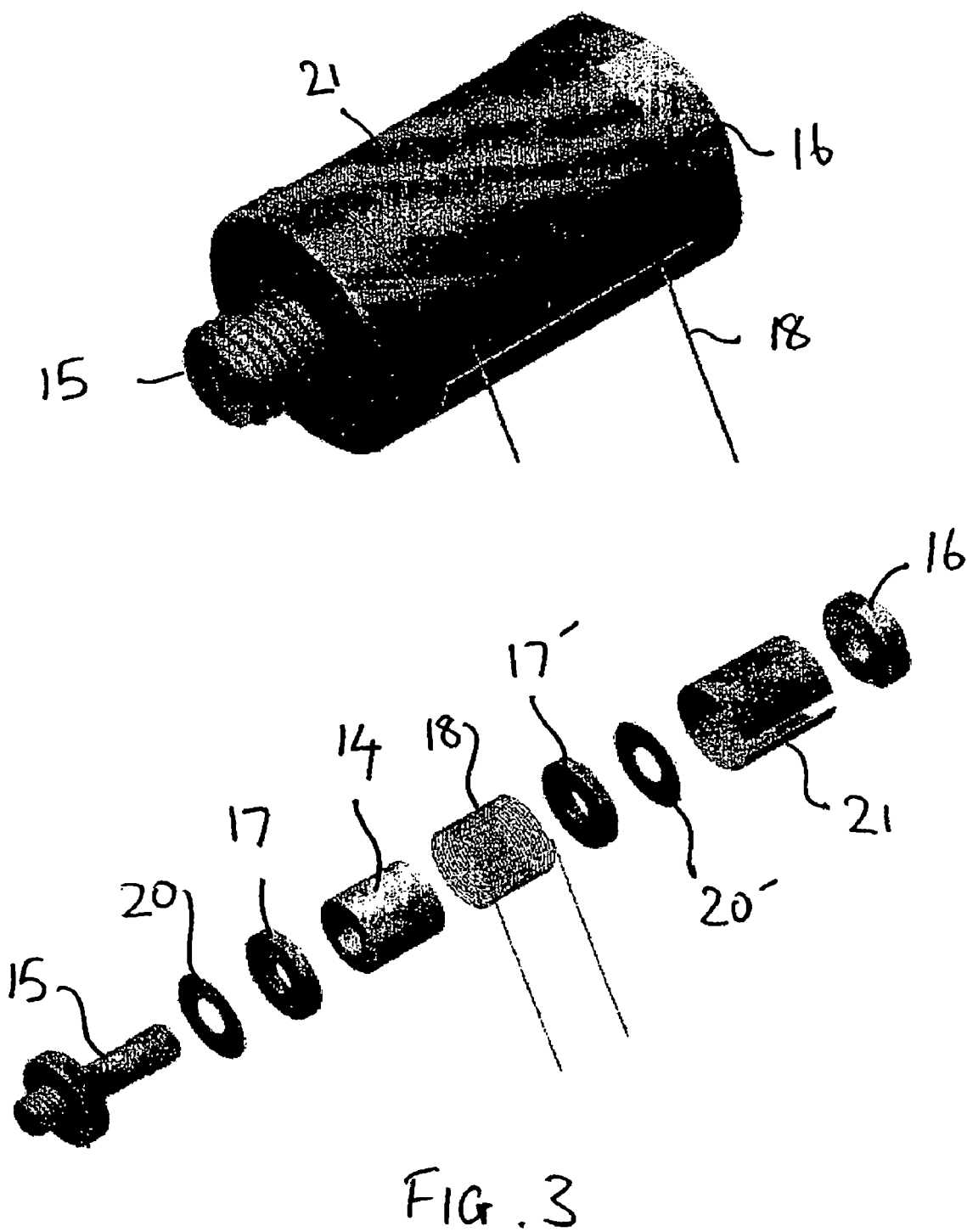
FIG. 3 shows a collapsed view and an exploded view of an ultrasonic transducer driver according to the invention.
Figure 4:
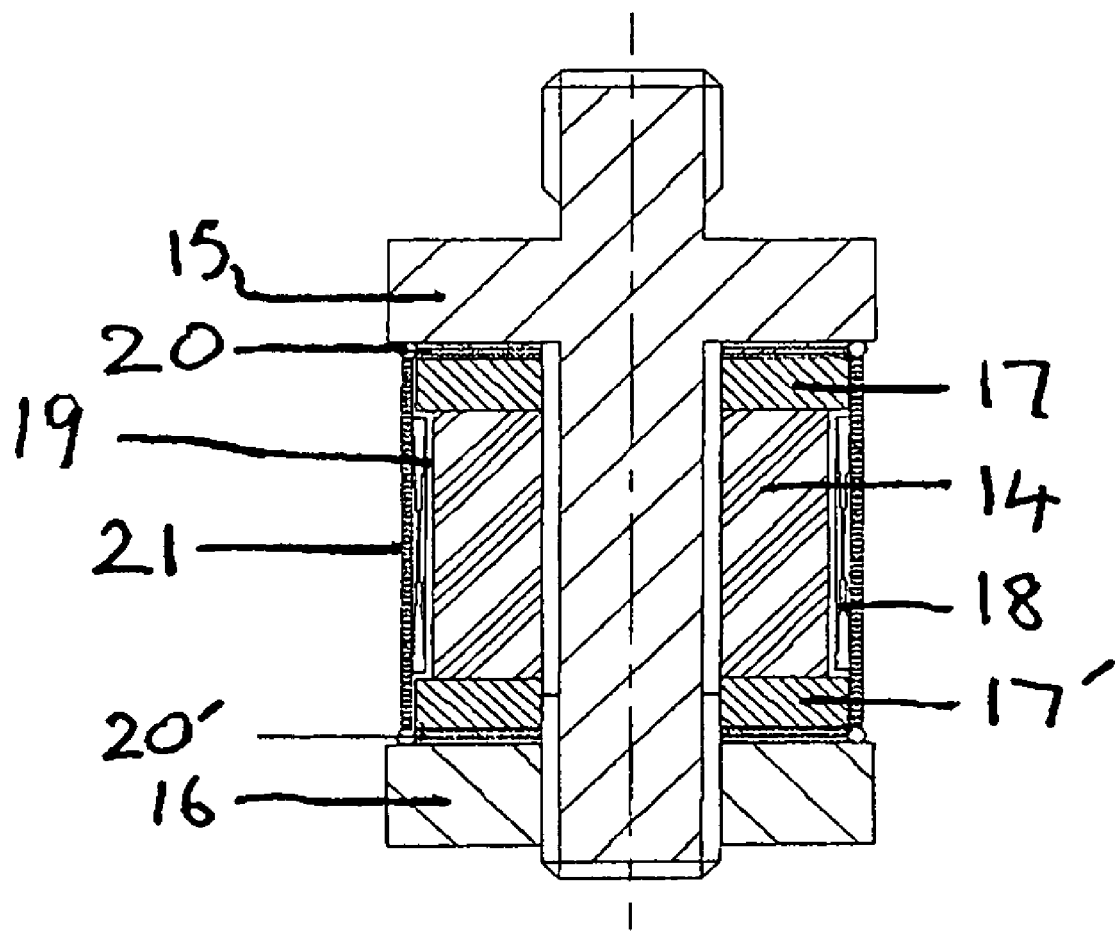
FIG. 4 is a cross-sectional view of the driver of FIG. 3.

Referring to FIGS. 3 and 4, the driver 5 functions as a half-wave, longitudinal, mass-spring-mass, linear vibrator to deliver ultrasonic vibrations to the adjoined horn 6. It has a giant magnetostrictive element 14 clamped mechanically under pressure by a pre-stress mechanism formed by a threaded shaft 15 and a nut 16 made of a high-strength, nonmagnetic metallic material, such as stainless steel 304, titanium alloys, aluminium alloys, or the like. A pair of ring-shaped permanent magnets 17, 17', which situate at both ends of the magnetostrictive element 14, provide a magnetic bias (or dc) field to the element 14 to produce an initial static mechanical strain. To ensure a uniform distribution of magnetic flux lines, the outer diameter of these magnets is slightly larger than that of the element (i.e., 1.2 times larger) and the diameter to thickness ratio of the magnets is about 12:1.

The magnets 17, 17' are preferably but not exclusively monolithic sintered or polymer-bonded neodymium iron boron (NdFeB) and samarium cobalt (SmCo) magnets. Sintered magnets have higher magnetic properties and better thermal stability, while polymer-bonded magnets provide higher electrical resistivity (i.e., they are less susceptible to eddy-current losses) and lower density. If sintered magnets are employed, it is preferably to provide a slit for the magnets so as to minimize the eddy-currents accumulating on their major surfaces.

A magnetic drive (or ac) field, is supplied by the drive solenoid 18 having any dimensions and any number of turns of enamelled metallic wire (i.e., enamelled copper wire) in one or more layers and surrounding the magnetostrictive element 14 with a finite air gap 19 in between. A magnetic drive (or ac) field provides an oscillating strain centered on the initial static strain. A magnetic circuit, which helps to channel magnetic fluxes into the element, is created with a pair of magnetic return-path rings 20, 20' on each end of the magnetostrictive element-permanent magnet assembly and an external magnetic return-path cylinder 21. The whole circuit is made of a high-permeability, high-resistivity and high-saturation material, such as powdered metal "T2", mu-metal, iron, nickel, cobalt, or the like.

The giant magnetostrictive element can be made from a material such as Terfenol-D. Terfenol-D is an alloy of rare-earth elements terbium (Tb) and dysprosium (Dy) and the transition metal iron (Fe). It exhibits giant linear strain (approx. 1200 ppm) and strain energy density (approx. 20 kJ/m$^3$) with an expeditious response (approx. 1 μs) at both room temperature and low fields (<150 kA/m). These values are about ten times better than piezoelectric materials and about one hundred times better than early transition metals. Furthermore, it is known that piezoelectric materials require an external, high electric "poling" field to induce an electric polarization. This results in a great difficulty in producing thick piezoelectric elements and, thus, stacking up multiple piezoelectric elements to achieve the desired power level is usually adopted in practice. By contrast, there is no need to "pole" these giant magnetostrictive materials so that a single element with variable dimensions, a more constant performance over time and a simpler fabrication process in device applications can be obtained.

Figure 5:
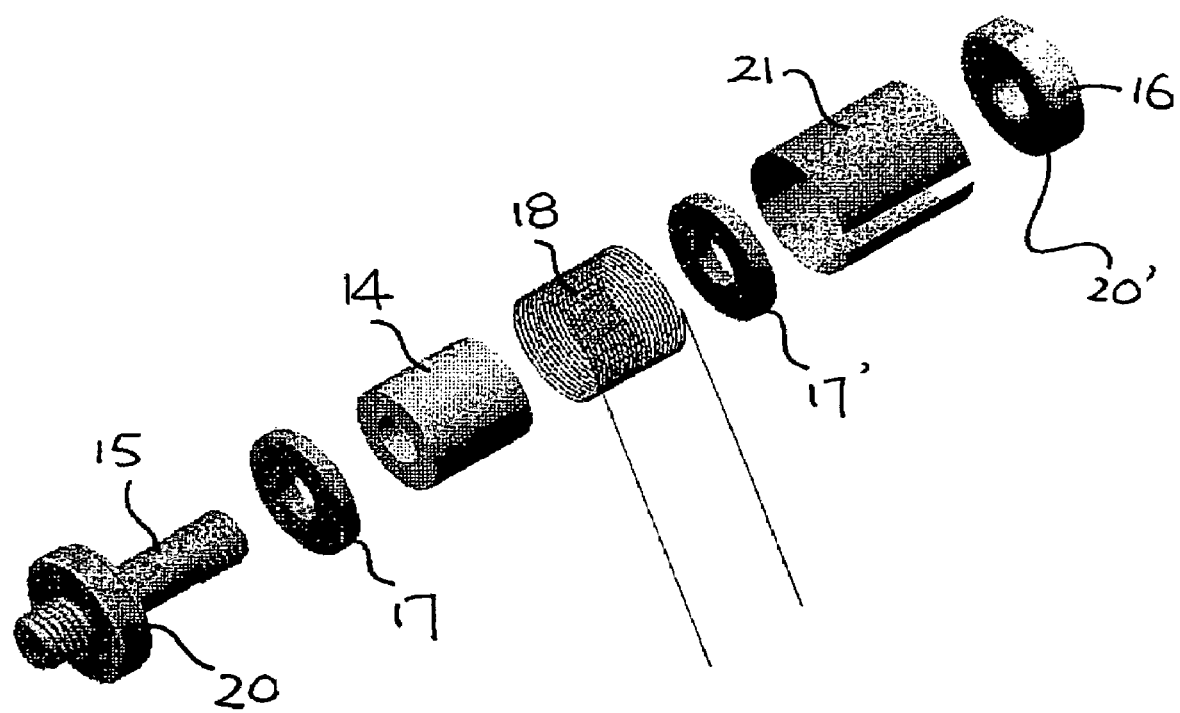
FIG. 5 is an exploded view of a second embodiment of an ultrasonic transducer driver according to the invention.

Referring to FIG. 5, in second embodiment of the driver the threaded shaft 15 and a monolithic magnetic return-path ring 20 are manufactured into a single component, while the nut 16 is combined with another monolithic magnetic return-path ring 20' to form another single component.

Figure 6:
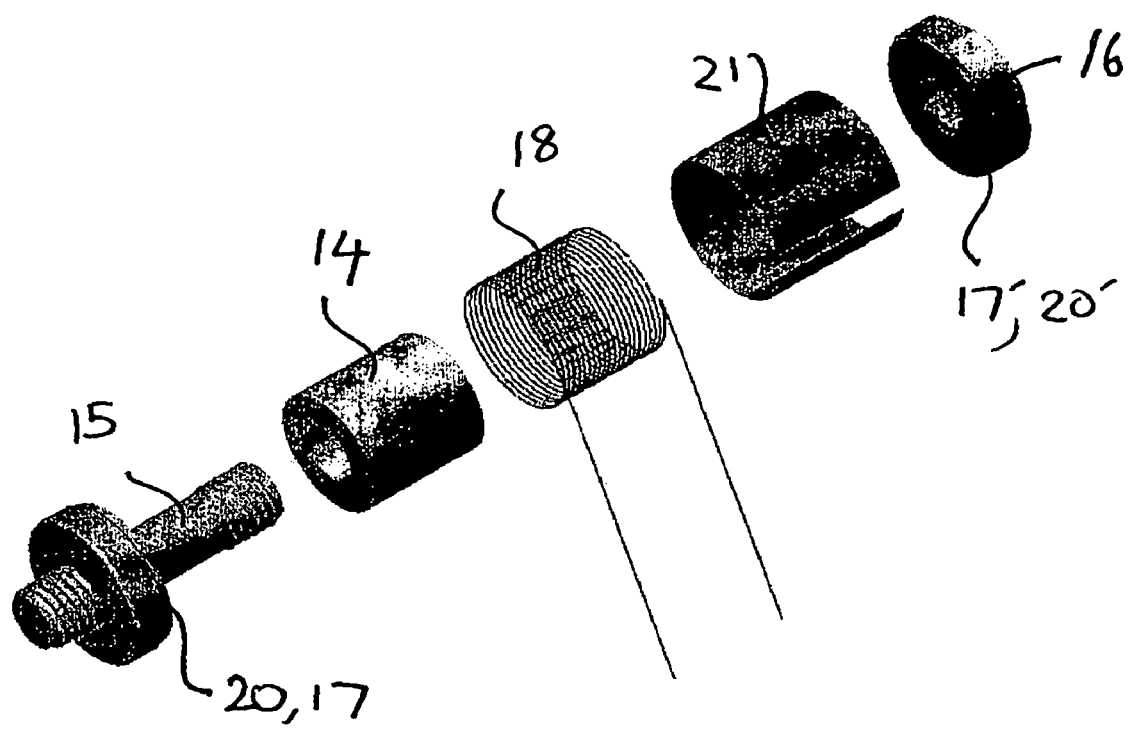
FIG. 6 is an exploded view of a third embodiment of an ultrasonic transducer driver according to the invention.

Referring to FIG. 6, in a third embodiment of the driver the threaded shaft 15, a monolithic magnetic return-path ring 20 and a monolithic permanent magnet ring 17 are manufactured into a single component, while the nut 16 is combined with another monolithic magnetic return-path ring 20' and another monolithic permanent magnet ring 17' to form another single component.

A layer of thick-film or thin-film magnetic return-path and/or a layer of thick-film or thin-film permanent magnet can be coated on the contacting surface of both the threaded shaft 15 and nut 16 by using thick-film technology and thin-firm techniques (i.e., sputtering, pulsed laser deposition (PLD), etc.), respectively. This design is advantageous in minimizing the number of components and hence the number of component interfaces appeared in the driver 5, thereby increasing the flexibility of assembly as well as the quality and reliability of the resulting driver 5. In general, giant magnetostrictive ultrasonic drivers/transducers require fewer components as compared with piezoelectric ultrasonic drivers/transducers counterparts. This suggests that a driver/transducer according to the invention not only possesses reduced size and weight but is also easier to assemble and cheaper to operate.

Figure 7:
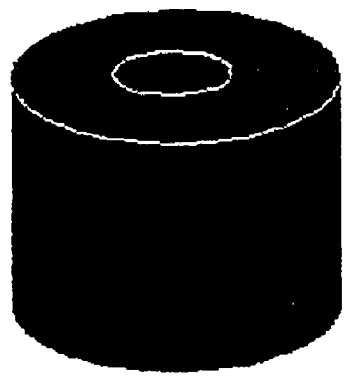
FIGS. 7a to 7f show different configurations of a giant magnetostrictive element for the driver.
Figure 7:
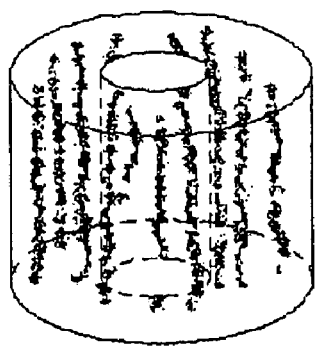
Figure 7:
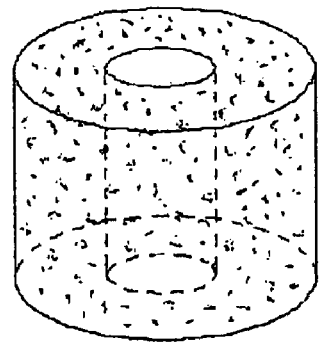
Figure 7:
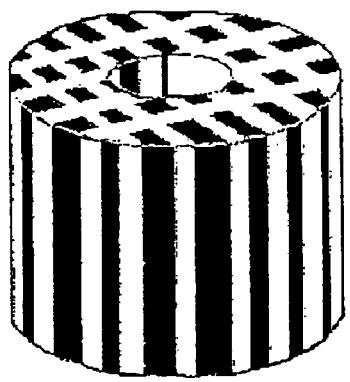
Figure 7:
Figure 7:
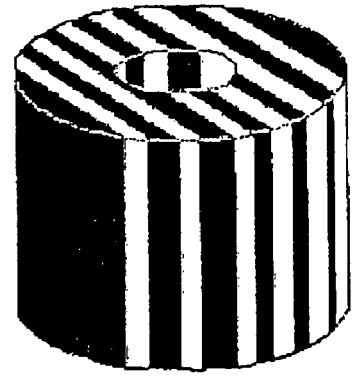

FIG. 7 shows different configurations of a giant magnetostrictive element 14 for the ultrasonic driver 5. It is noted that any shape is possible even though a cylindrical shape with a central hole is shown. FIG. 7a illustrates a monolithic giant magnetostrictive element. While usefulness, monolithic materials, being alloys, generally have two disadvantages. The first is the limitation of the operational frequency to a few kilohertz due to the presence of eddy-current losses, while the second is difficulties in machining and fabricating devices owing to the brittleness of the material. By fabricating the monolithic materials into a composite form comprising two or more monolithic parts separated from one another by at least a layer of passive polymeric material (i.e. epoxy), the materials' bandwidths can conveniently be extended into the ultrasonic regime (>=20 kHz) and their brittleness can significantly be reduced due to increased electrical resistivity and mechanical durability, respectively.

FIGS. 7b to 7f show a composite giant magnetostrictive element in different configurations. These composites in turn include, but are: not limited to, pseudo 1-3 (i.e., giant magnetostrictive particles are aligned longitudinally in the polymer matrix), 0-3 (i.e. giant magnetostrictive particles are dispersed randomly in the polymer matrix), 1-3 (i.e., polymeric layers are extended transversely in an orthogonal direction), radial 2-2 (i.e., polymeric layers are extended radially in any direction) and parallel 2-2 (i.e., polymeric layers are extended transversely in a single direction) configurations.

Figure 8:
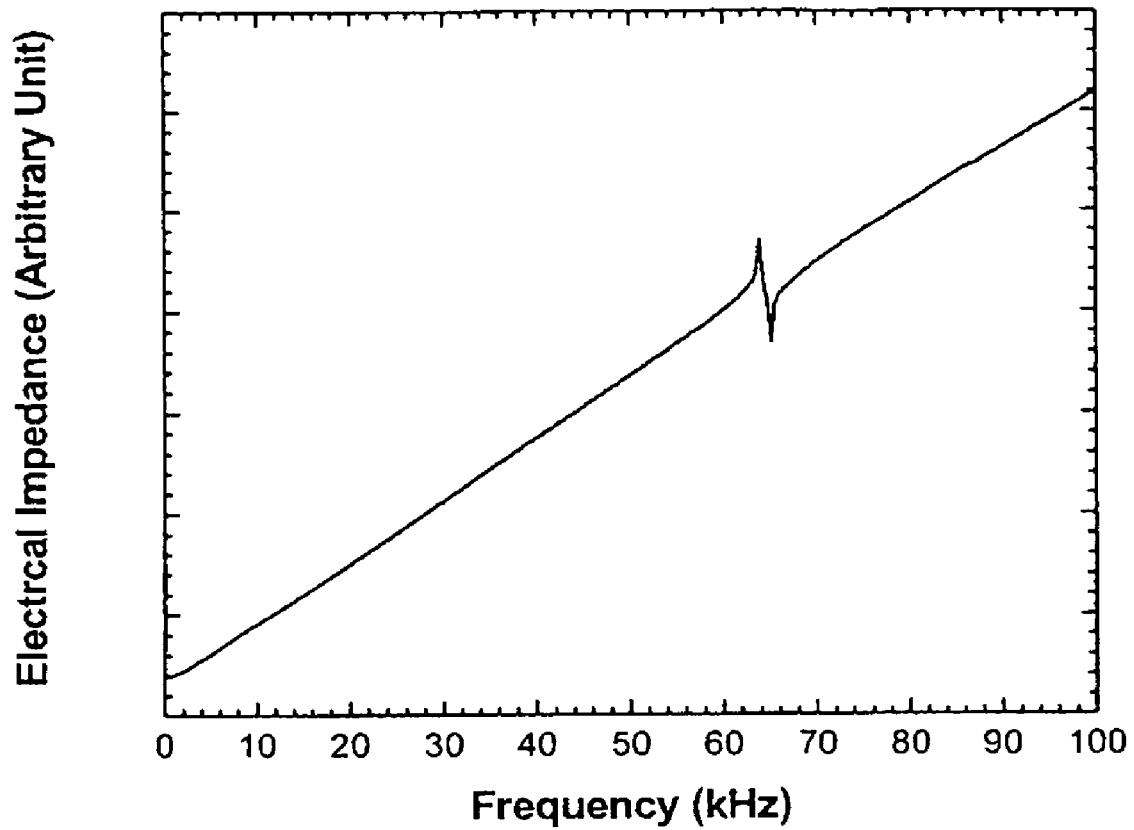
FIG. 8 is a plot of electrical impedance against frequency for an embodiment of the present invention made using Terfenol-D/epoxy pseudo 1-3 composite as shown in FIG. 7b.

FIG. 8 shows a plot of electrical impedance against frequency for an ultrasonic driver using the pseudo 1-3 giant magnetostrictive element of FIG. 7b made of a Terfenol-D/epoxy composite. The transducer resonates at approx. 64 kHz. Apart from this resonance, the electrical impedance increases essentially linear with increasing frequency, i.e., the transducer behaves like an inductor. This implies that eddy-current losses are insignificant in this transducer for frequencies up to 100 kHz.

Figure 9:
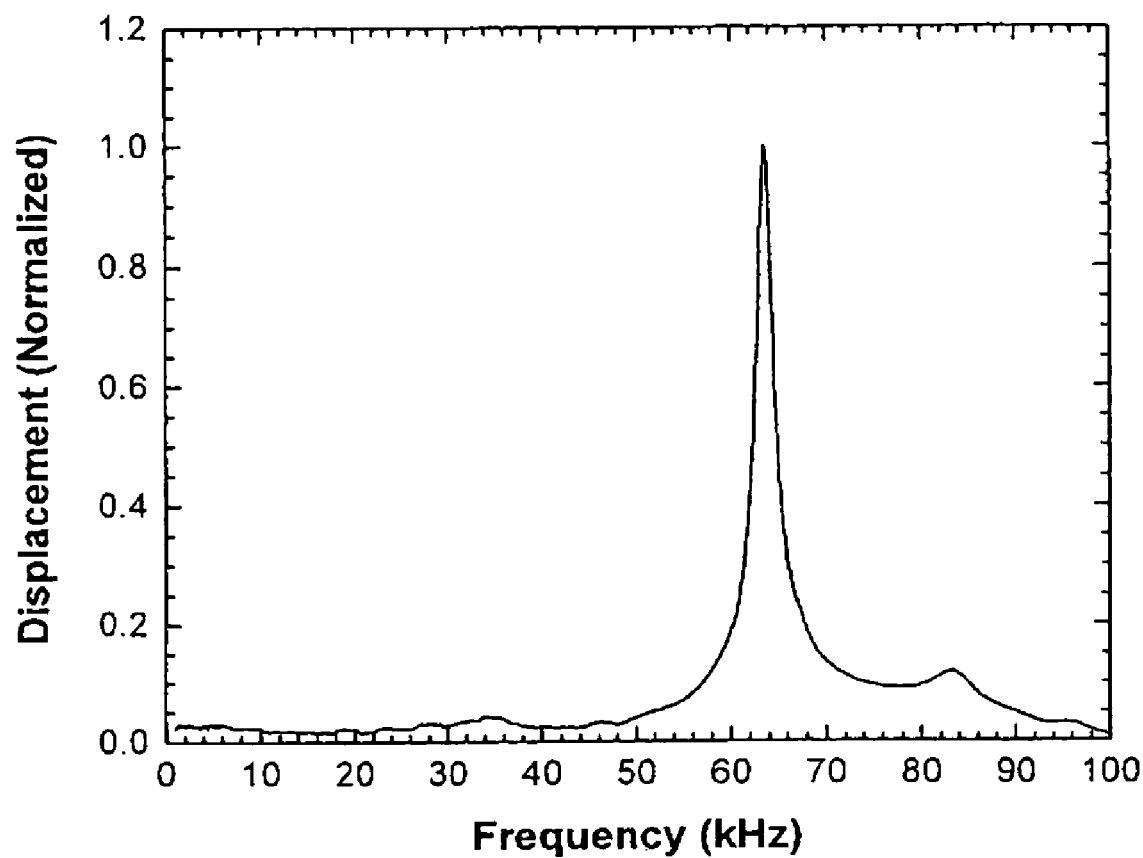
FIG. 9 is a plot of displacement amplitude against frequency for the transducer of FIG. 8.

FIG. 9 is a plot of displacement amplitude against frequency for the transducer of FIG. 8. As in FIG. 8 the displacement has a flat response up to and beyond the fundamental resonance of the transducer without eddy-current losses. At resonance the displacement amplitude is about 40 times that of the low frequency data, i.e., 1 kHz.

By using giant magnetostrictive materials in the driver, in particular the rare-earth-alloy-based materials such as Terfenol-D and its composites, novel ultrasonic transducers possessing improved power-handling capability with a higher efficiency and a better reliability are obtained for wire bonding applications.

What is claimed is:

1. A bonding apparatus for a wire bonding machine comprising:
   a bonding tool coupled to an ultrasonic transducer, said transducer comprising:
     a giant magnetostrictive element,
     a fastener for holding the giant magnetostrictive element under mechanical pressure,
     a first field generator for providing a magnetic bias field,
     a second field generator for providing a magnetic drive field, and
     magnetic circuit for channeling the magnetic fields in the giant magnetostrictive element, wherein said giant magnetostrictive element is a composite comprising two or more rare-earth-based giant magnetostrictive alloy parts separated from one another only by a layer of passive polymeric material.

2. The apparatus of claim 1 wherein the giant magnetostrictive element is a rare-earth-alloy-based material.

3. The apparatus of claim 1 wherein the giant magnetostrictive element is Terfenol-D and its composites.

4. The apparatus of claim 1 wherein the giant magnetostrictive element is cylindrical with a central hole.

5. The driver of claim 1 wherein the fastener is a threaded shaft and a nut made of nonmagnetic metallic material.

6. The driver of claim 1 wherein the first field generator is a permanent magnet.

7. The driver of claim 1 wherein the second field generator is an electric coil.

8. The apparatus of claim 1 wherein the magnetic circuit comprises a pair of magnetic return-path rings and a magnetic return-path cylinder having high-permeability, high-resistivity and high-saturation.

9. A bonding apparatus for a wire bonding machine comprising:
   a horn having a bonding tool at a smaller end and a mounting collar at an opposite end, and
   an ultrasonic transducer coupled to the horn and comprising a giant magnetostrictive element, a fastener for holding the giant magnetostrictive element under mechanical pressure, a first field generator for providing a magnetic bias field, a second field generator for providing a magnetic drive field, and a magnetic circuit for channeling the magnetic fields in the giant magnetostrictive element,
   wherein the giant magnetostrictive element is a composite comprising two or more rare-earth-based giant magnetostrictive alloy parts separated from one another only by a layer of passive polymeric material.

10. The apparatus of claim 9 wherein the giant magnetostrictive element is a rare-earth-alloy-based material.

11. The apparatus of claim 9 wherein the giant magnetostrictive element is Terfenol-D and its composites.

12. The apparatus of claim 9 wherein the giant magnetostrictive element is cylindrical with a central hole.

13. The apparatus of claim 9 wherein the fastener is a threaded shaft and a nut made of nonmagnetic metallic material.

14. The apparatus of claim 9 wherein the first field generator is a permanent magnet.

15. The apparatus of claim 9 wherein the second field generator is an electric coil.

16. The apparatus of claim 9 wherein the magnetic circuit comprises a pair of magnetic return-path rings and a magnetic return-path cylinder having high-permeability, high-resistivity and high-saturation.

17. The apparatus of claim 1 wherein the giant magnetostrictive element comprises an aperture longitudinally connecting a first end of the element to an opposing second end of the element and the fastener comprises a longitudinally extending central portion disposed within the giant magnetostrictive element aperture, a first portion extending from the first end of the element, a first thrust face attached to the first portion adjacent the element first end, a second end extending from the second end of the element and a second thrust face adjacent the element second end attached to the second portion, wherein the fastener is made of nonmagnetic metallic material.

18. A bonding apparatus for a wire bonding machine comprising:
   a bonding tool coupled to an ultrasonic transducer, said ultrasonic transducer comprising:
     a central supporting member,
     a giant magnetostrictive element surrounding the supporting member, said giant magnetostrictive element having a first end and a second end and comprising two or more rare-earth based giant magnetostrictive alloys,
     pair of permanent magnets surrounding the supporting member, one of the pair of permanent magnets located at the first end of the giant magnetostrictive element and the other one of the pair of permanent magnets located at the second end of the giant magnetostrictive element, fastener for holding the giant magnetostrictive element and the permanent magnets under mechanical pressure on the supporting member, a coil surrounding the giant magnetostrictive element for providing a magnetic driving field, and a magnetic circuit surrounding the giant magnetostrictive element, permanent magnetic and coil.

* * * * *

UNITED STATES PATENT AND TRADEMARK OFFICE
CERTIFICATE OF CORRECTION

PATENT NO. : 7,462,960 B2 Page 1 of 1
APPLICATION NO. : 10/751718
DATED : December 9, 2008
INVENTOR(S) : Or et al.

It is certified that error appears in the above-identified patent and that said Letters Patent is hereby corrected as shown below:

<u>Column 5</u>:
Line 62, delete "driver" and substitute --apparatus--.

Line 64, delete "driver" and substitute --apparatus--.

Line 66, delete "driver" and substitute --apparatus--.

<u>Column 6</u>:
Line 62, before "pair" insert --a--.

<u>Column 7</u>:
Line 1, before "fastener" insert --a--.

Signed and Sealed this

Seventeenth Day of March, 2009

JOHN DOLL
*Acting Director of the United States Patent and Trademark Office*